(12) United States Patent
Kim

(10) Patent No.: US 7,999,316 B2
(45) Date of Patent: Aug. 16, 2011

(54) SEMICONDUCTOR DEVICE AND METHOD FOR MANUFACTURING THE SAME

(75) Inventor: Baek Won Kim, Seongbuk-gu (KR)

(73) Assignee: Dongbu Hitek Co., Ltd., Seoul (KR)

( * ) Notice: Subject to any disclaimer, the term of this patent is extended or adjusted under 35 U.S.C. 154(b) by 519 days.

(21) Appl. No.: 12/247,266

(22) Filed: Oct. 8, 2008

(65) Prior Publication Data

US 2009/0166724 A1 Jul. 2, 2009

(30) Foreign Application Priority Data

Dec. 26, 2007 (KR) .................... 10-2007-0137157

(51) Int. Cl.
*H01L 47/00* (2006.01)
*H01L 21/336* (2006.01)

(52) U.S. Cl. ......... 257/341; 257/E47.001; 257/E21.409; 438/268

(58) Field of Classification Search .................. 257/328, 257/E47.001, E21.409, 314, 326, E27.078, 257/E29.3–E29.309, E21.179–E21.182, E21.209–E21.21, 257/E21.422, E21.423, E21.679–E21.694, 257/135–136, 242, 329, E27.091, E27.095–E27.096, 257/E29.118, E29.274, E29.313, E29.318, 257/E29.262, 120, 124, 133, 127, 146, 153, 257/175, E21.41, E21.629, E21.643, E27.015; 438/133, 170, 189, 202–208, 309–378, 234–239

See application file for complete search history.

(56) References Cited

U.S. PATENT DOCUMENTS 7,816,729 B2 * 10/2010 Hshieh ........................ 257/330
2008/0303081 A1 * 12/2008 Hshieh ........................ 257/328

* cited by examiner

*Primary Examiner* — Dao H Nguyen
*Assistant Examiner* — Tram H Nguyen
(74) *Attorney, Agent, or Firm* — Salieanchik, Lloyd & Eisenschenk

(57) ABSTRACT

Disclosed is a vertically arranged semiconductor device. The semiconductor device can include a semiconductor substrate comprising a first conductive type buried layer, a first conductive type drift region formed on the first conductive type buried layer, and a second conductive type well formed on the first conductive type drift region. A gate insulating layer and a gate electrode can be formed in regions of the substrate from which the first conductive type drift region and the second conductive type well are selectively removed. A first conductive type source region can be formed at sides of the gate electrode. A n insulating layer can be formed on the semiconductor substrate including the gate electrode and can include a trench formed through the insulating layer and a portion of the second conductive type well. A barrier layer can be formed in the trench and a source contact including tungsten and aluminum can be deposited in the trench. A drain electrode layer can be formed on a bottom surface of the substrate below the first conductive type buried layer.

14 Claims, 8 Drawing Sheets

SEMICONDUCTOR DEVICE AND METHOD FOR MANUFACTURING THE SAME

CROSS-REFERENCE TO RELATED APPLICATION

The present application claims the benefit under 35 U.S.C. §119 of Korean Patent Application No. 10-2007-0137157, filed Dec. 26, 2007, which is hereby incorporated by reference in its entirety.

BACKGROUND

A power transistor may have a structure in which a source region is formed on a semiconductor substrate and a drain region is formed below the source region, so that a channel is vertically formed.

In the power transistor having such a structure, various researches have been conducted to improve operating characteristics according to driving voltage by minimizing the distance between the source and drain regions.

BRIEF SUMMARY

Embodiments of the present invention provide a semiconductor device and a method for manufacturing the same that can be applied to a power transistor.

According to an embodiment, a semiconductor device and a method for manufacturing the same is provided which can reduce the distance between a source region and a drain region.

In an embodiment, a semiconductor device and a method for manufacturing the same can efficiently form a contact in a source region.

A semiconductor device according to an embodiment includes a semiconductor substrate comprising a first conductive type buried layer, a first conductive type drift region formed on the first conductive type buried layer, and a second conductive type well formed on the first conductive type drift region; a gate insulating layer and a gate electrode formed in regions of the substrate from which the first conductive type drift region and the second conductive type well are selectively removed; a first conductive type source region formed at sides of the gate electrode; an insulating layer formed on the semiconductor substrate including the gate electrode; a barrier layer formed on surfaces of a trench from which the second conductive type well and the insulating layer are selectively removed; a source contact including tungsten deposited in the trench and aluminum formed on the tungsten; and a drain electrode layer formed below the first conductive type buried layer.

A method for manufacturing a semiconductor device according to an embodiment includes forming a first conductive type buried layer and a first conductive type drift region, on a semiconductor substrate; forming a first trench by selectively removing a portion of the first conductive type drift region; forming a gate insulating layer and a gate electrode in the first trench; forming a second conductive type well on the first conductive type drift region; forming a first conductive type source region in the second conductive type well at sides of the gate electrode; forming an interlayer dielectric layer on the semiconductor substrate; forming a second trench by selectively etching the interlayer dielectric layer and a portion of the second conductive type well; forming a barrier layer in the trench; forming a source contact by filling tungsten and aluminum in the trench in which the barrier layer is formed; and forming a drain electrode layer under the first conductive type buried layer.

DETAILED DESCRIPTION

Figure 1:
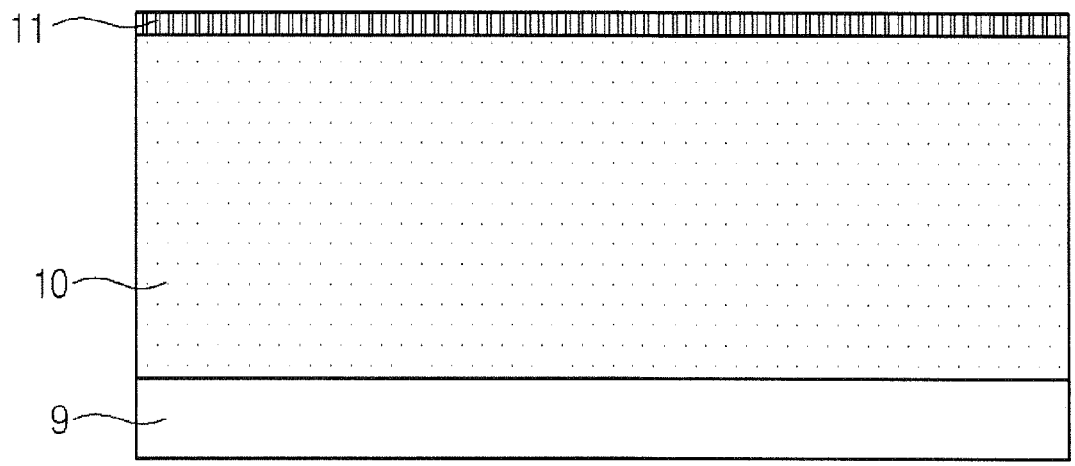
FIGS. 1 to 15 are cross-sectional views for illustrating a method for manufacturing a semiconductor device according to an embodiment of the present invention.

When the terms "on" or "over" are used herein, when referring to layers, regions, patterns, or structures, it is understood that the layer, region, pattern or structure can be directly on another layer or structure, or intervening layers, regions, patterns, or structures may also be present. When the terms "under" or "below" are used herein, when referring to layers, regions, patterns, or structures, it is understood that the layer, region, pattern or structure can be directly under the other layer or structure, or intervening layers, regions, patterns, or structures may also be present.

The thickness or size of layers shown in the drawings have been simplified or exaggerated for the purpose of clear explanation. In addition, the size of each element may be reduced or magnified from the real size thereof.

Hereinafter, embodiments of a semiconductor device and a method for manufacturing the same will be described with reference to accompanying drawings.

Figure 15:
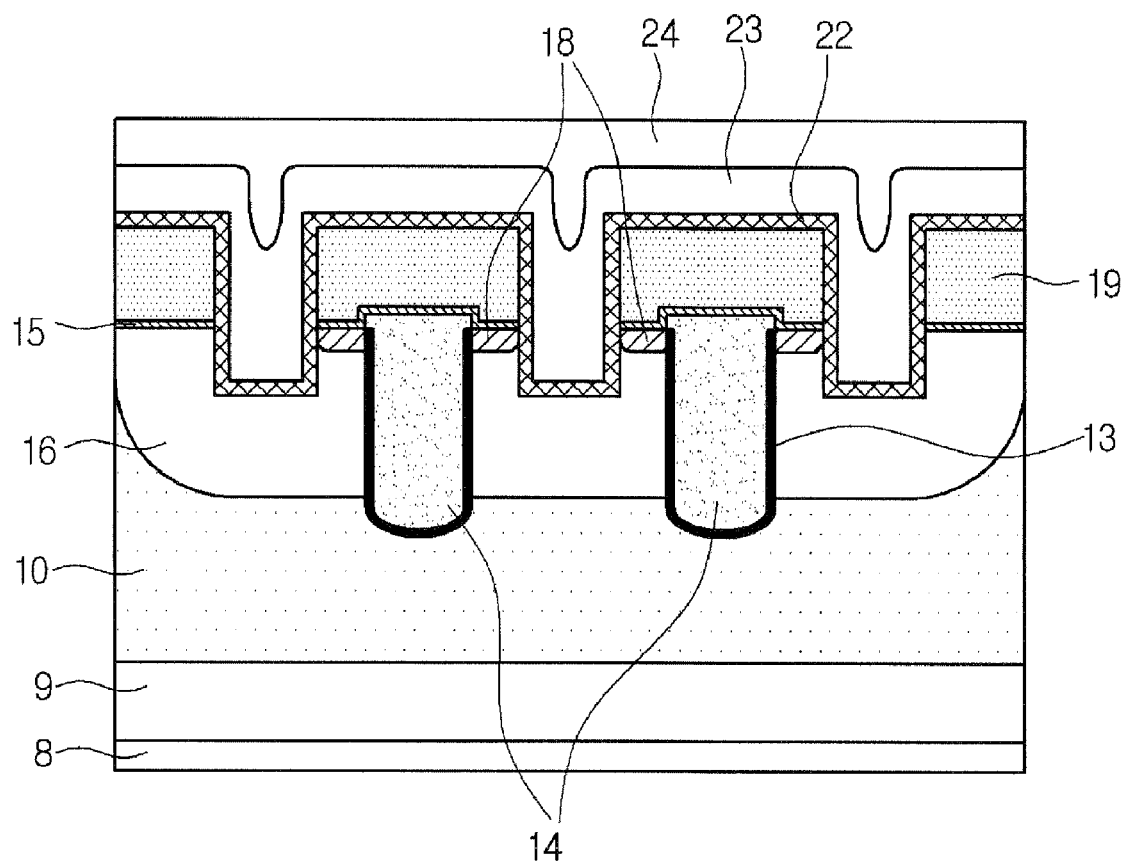

FIG. 15 is a cross-sectional view illustrating a semiconductor device according to an embodiment.

Referring to FIG. 15, a semiconductor device can include a first conductive type buried layer 9 and a first conductive type drift region 10 in a semiconductor substrate. A drain electrode 8 can be disposed on a bottom surface of the first type buried layer 9. A second conductive type well 16 can be formed on the first conductive type drift region 10.

A gate insulating layer 13 and gate electrode 14 can be provided in regions of the first conductive type drift region 10 and the second conductive type well 16 that were selectively removed. A first conductive type source region 18 can be provided on the semiconductor substrate corresponding to sides of the gate electrode 14.

An oxide layer 15 and an interlayer dielectric layer 19 can be provided on the gate electrode 14 and the first conductive type source region 18.

Trenches formed at sides of the first conductive type source region 18 and filled with a barrier layer 22 and metal material can provide source contacts.

According to a specific embodiment, tungsten 23 and aluminum 24 are used as the material for a source contact, In the semiconductor device as described above, as power is applied thereto, a channel is vertically formed between the source region 18 and the drain electrode 8, so that electrons move through the channel.

According to an embodiment, the trench for the source contact is formed to reduce the distance between the source region 18 and the drain electrode 8. When aluminum 24 is filled in the trench for the source contact, a void may frequently occur. In this regard, before an aluminum sputtering process, tungsten can be deposited through a CVD (chemical vapor deposition) process to inhibit void formation.

Hereinafter, a method for manufacturing the semiconductor device will be described with reference to FIGS. 1 to 15.

Referring to FIG. 1, a hard mask layer 11 can be formed on a semiconductor substrate on which a first conductive type buried layer 9 and a first conductive type drift region 10 are formed. In certain embodiments, the hard mask layer 11 can include an oxide layer or a nitride layer.

Figure 2:
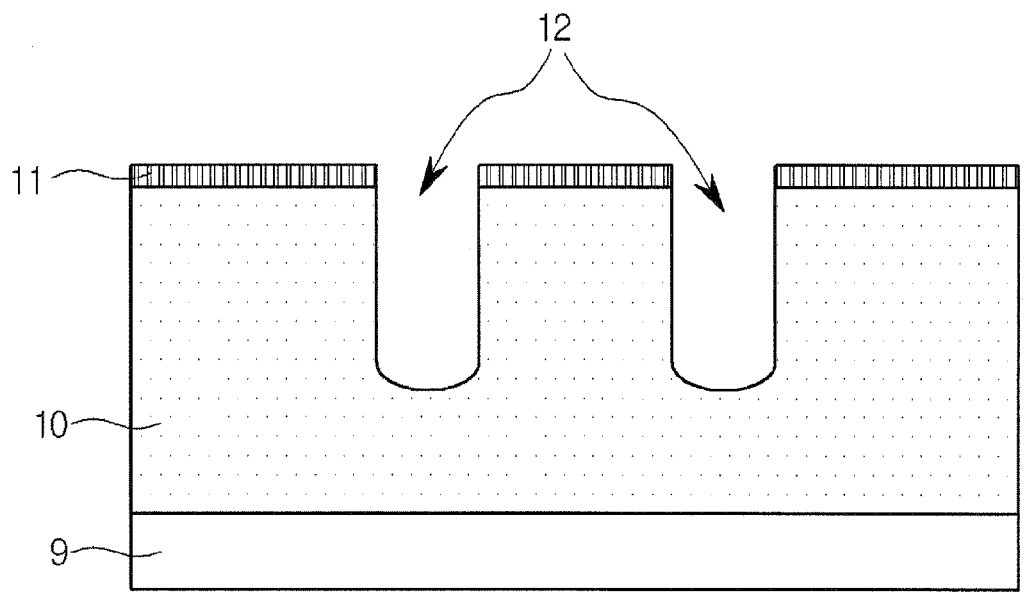

Referring to FIG. 2, a photoresist layer pattern (not shown) can be formed on the hard mask layer 11. Then, the substrate can be subject to an etch process to form a first trench 12 in the first conductive type drift region 10. The first trench 12 is formed to provide a gate electrode region. The drawings show two trenches 12 for gate electrodes. However, one, two or more first trenches 12 can be formed as desired.

Figure 3:
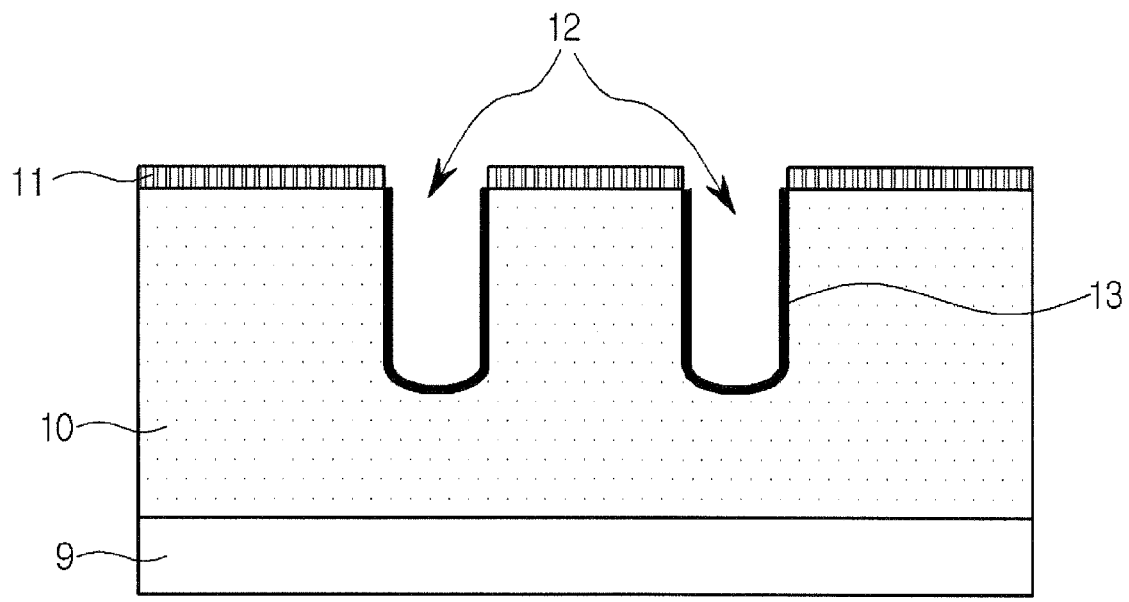

Referring to FIG. 3, an oxide layer can be formed in the first trenches 12 to form a gate insulating layer 13. In one embodiment, the oxide layer can be deposited.

Figure 4:
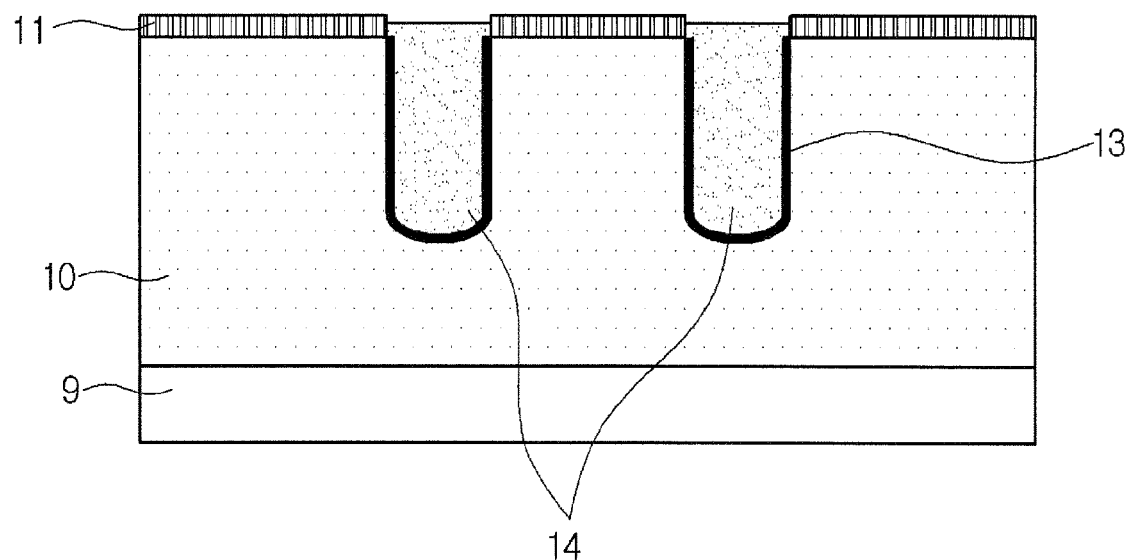

Referring to FIG. 4, a gate electrode 14 can be formed on the gate insulating layer 13 within the trench. According to an embodiment, polysilicon can be deposited on the semiconductor substrate including the trenches 12 to fill the trenches. Then, the polysilicon layer is etched such that the polysilicon remains only in the trenches 12. Thus, the gate insulating layer 13 and the gate electrodes 14 can be provided in the trenches 12.

Figure 5:
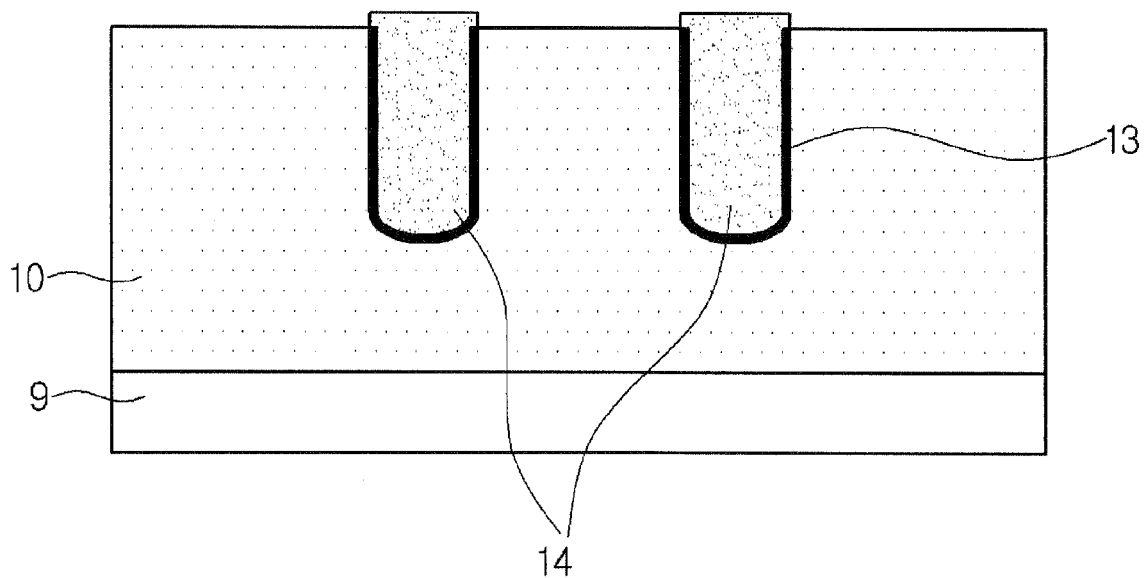
Figure 6:
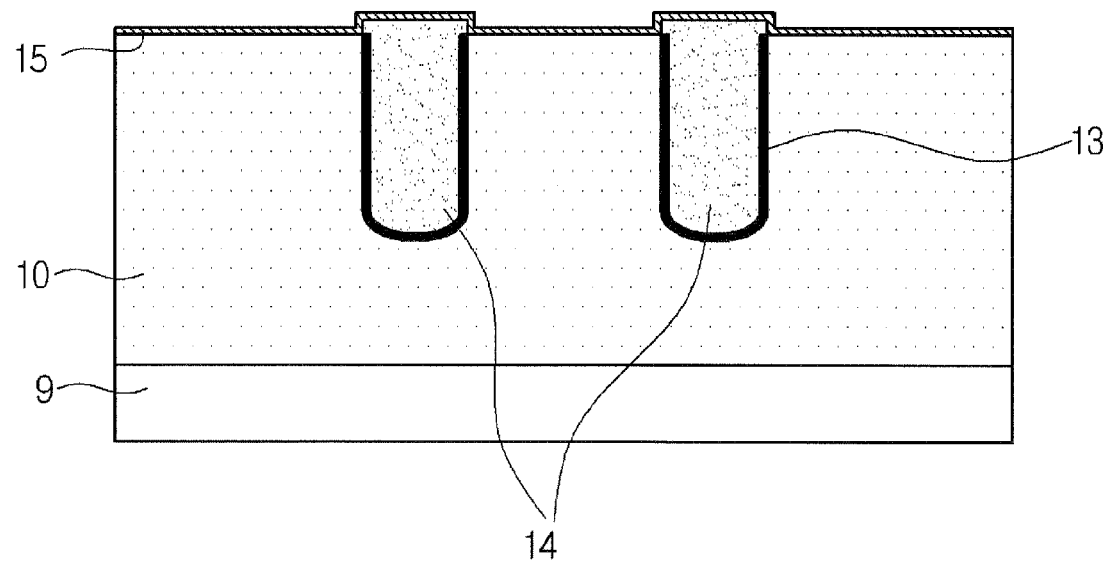

Referring to FIGS. 5 and 6, the hard mask layer 11 formed on the semiconductor substrate is removed and then an oxide layer 15 can be formed on the semiconductor substrate including the gate electrodes 14. The oxide layer 15 can be used to isolate the gate electrodes 14 and reduce damage to the semiconductor substrate during a subsequent impurity implantation process.

Figure 7:
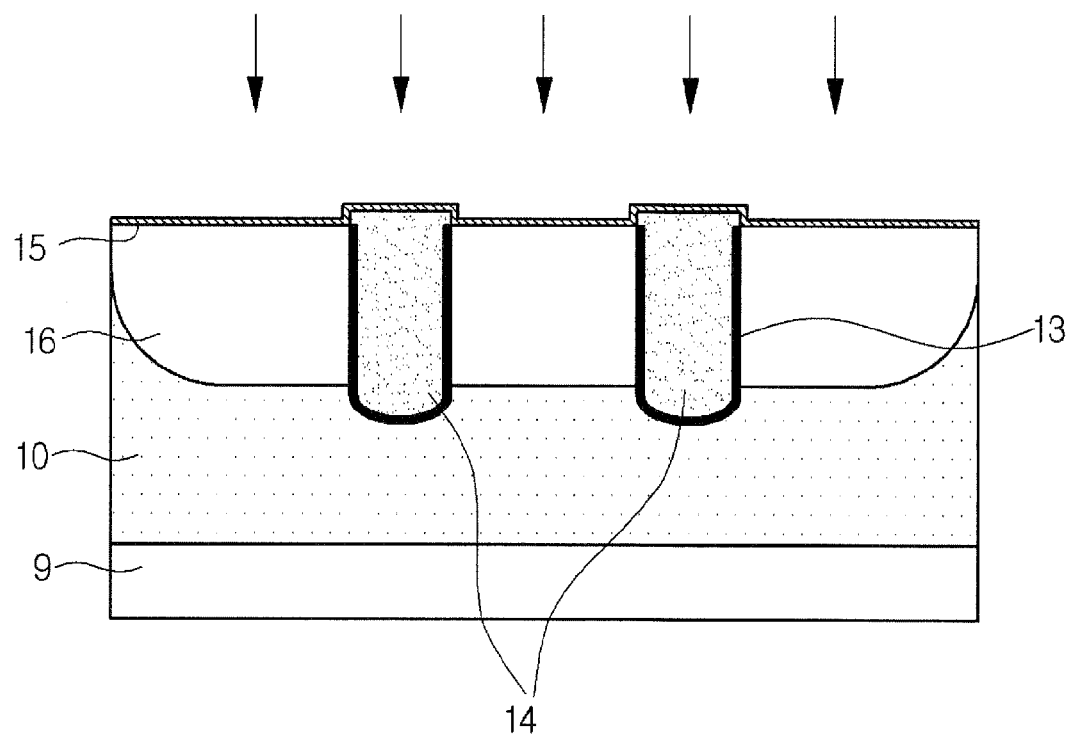

Referring to FIG. 7, second conductive type impurity ions can be implanted into the semiconductor substrate to form a second conductive type well 16. A heat treatment can be performed to diffuse the second conductive type impurity ions of the second conductive type well 16.

Figure 8:
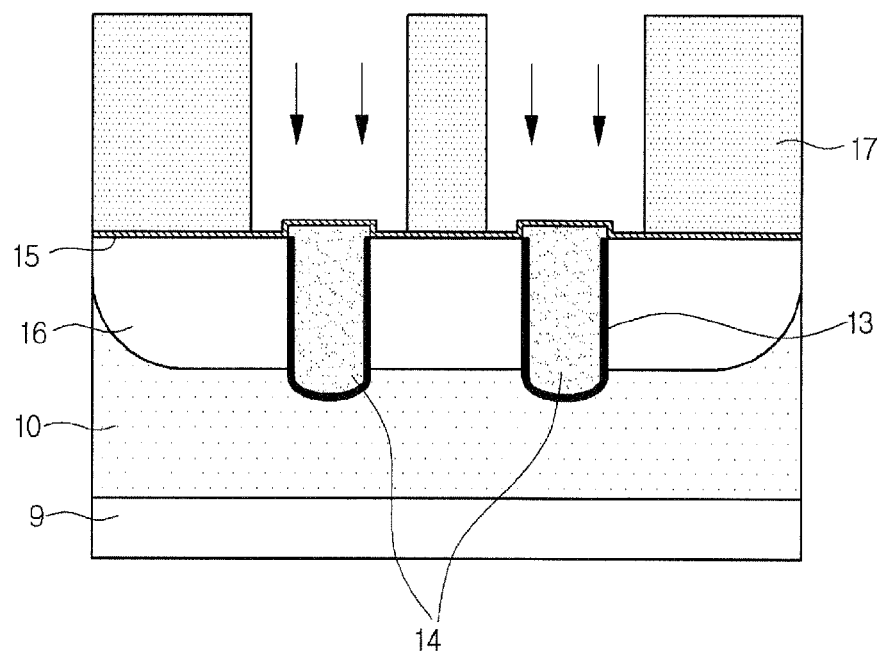
Figure 9:
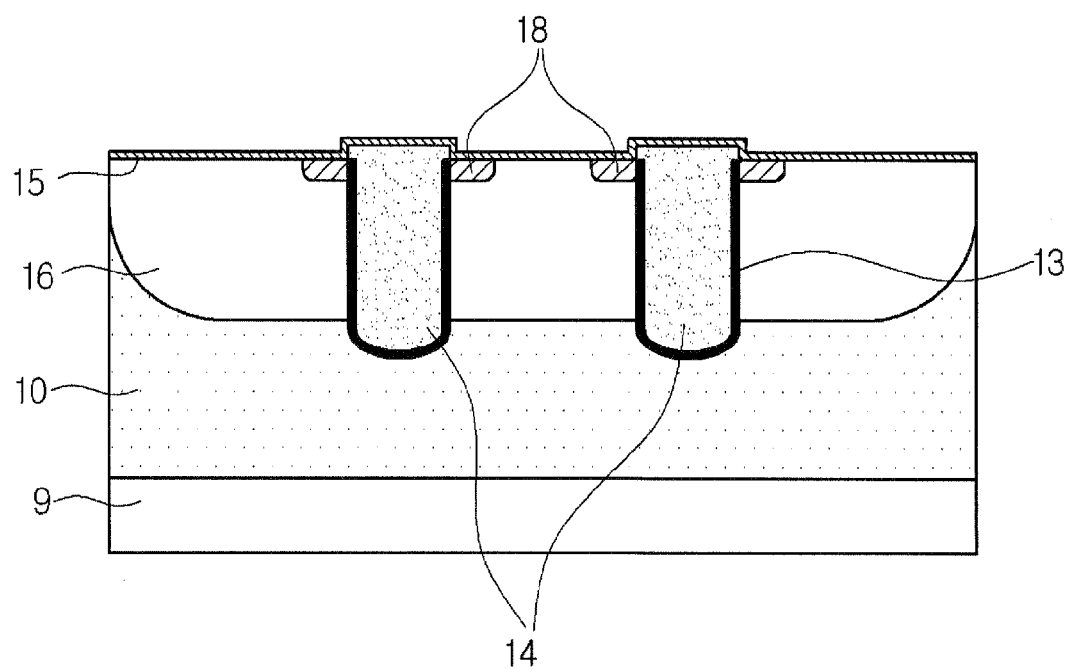

Referring to FIGS. 8 and 9, a photoresist layer pattern 17 can be formed on the semiconductor substrate exposing source regions. Then first conductive type impurity ions can be implanted thereto. After implanting the ions, the photoresist layer pattern 17 can be removed.

The semiconductor substrate can be subject to a heat treatment to diffuse the ions such that the first conductive source region 18 is formed at sides of the gate electrode 14.

Figure 10:
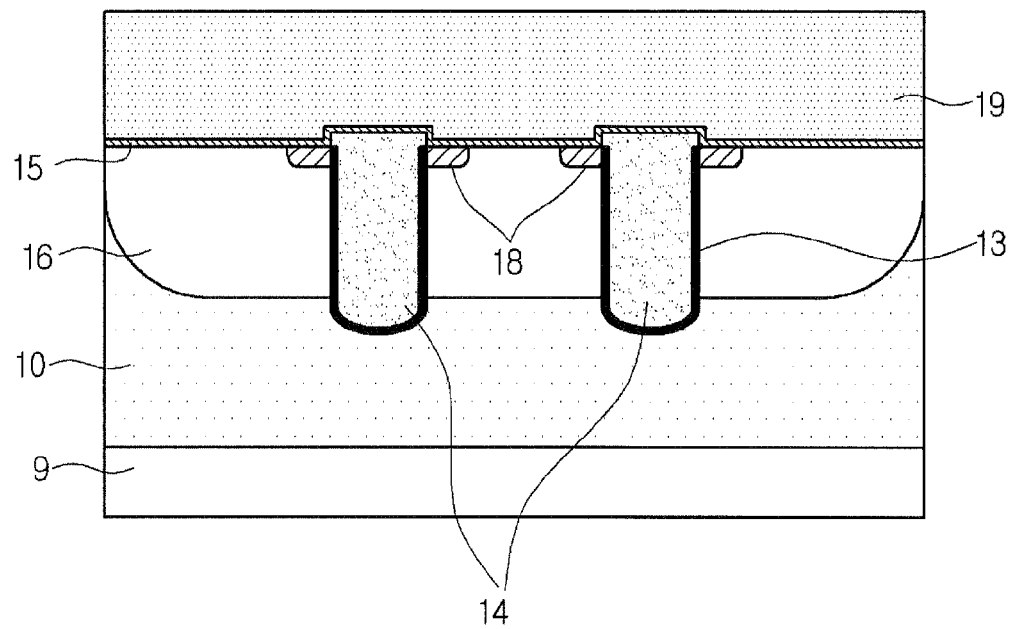
Figure 11:
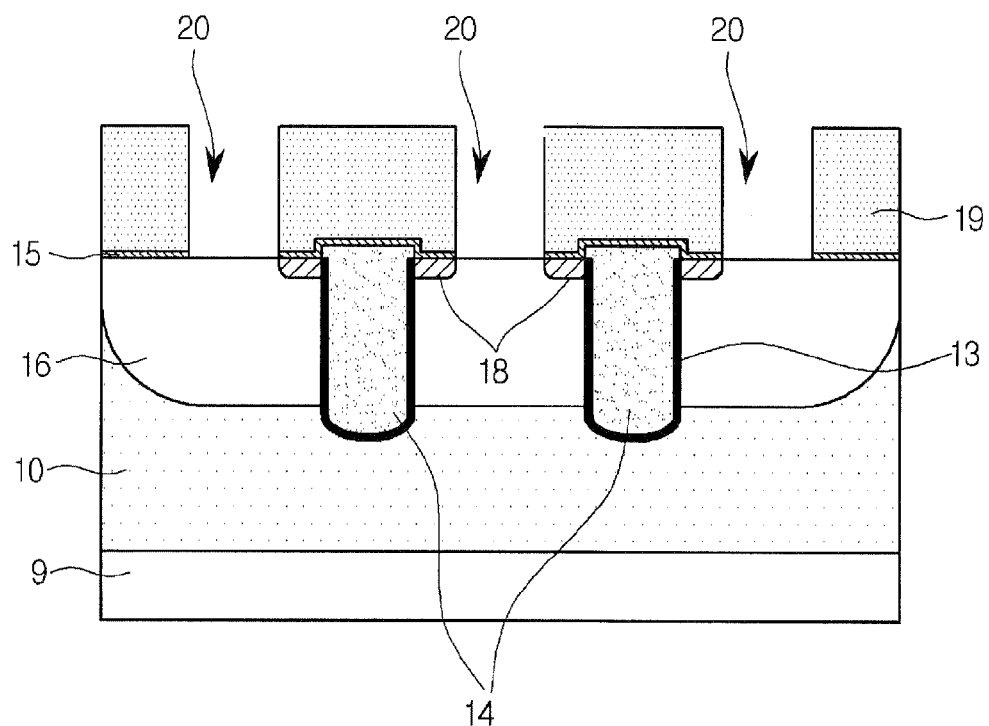

Referring to FIG. 10, an interlayer dielectric layer 19 can be formed on the semiconductor substrate and a photoresist layer pattern (not shown) can be formed on the interlayer dielectric layer 19. Then, as shown in FIG. 11, the interlayer dielectric layer 19 and the oxide layer 15 can be selectively removed by using the photoresist layer pattern as a mask, thereby forming second trenches 20.

Figure 12:
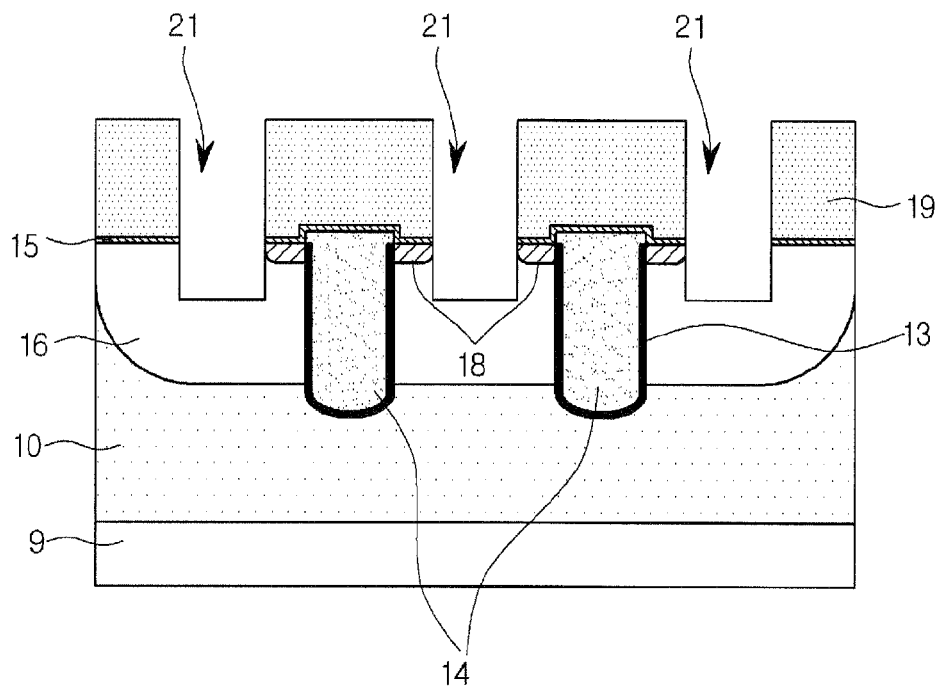

Next, referring to FIG. 12, a portion of the second conductive type well 16 of the semiconductor substrate exposed by the second trenches 20 can be selectively removed by using the interlayer dielectric layer 19 and the oxide layer 15 as a mask, thereby forming third trenches 21.

Figure 13:
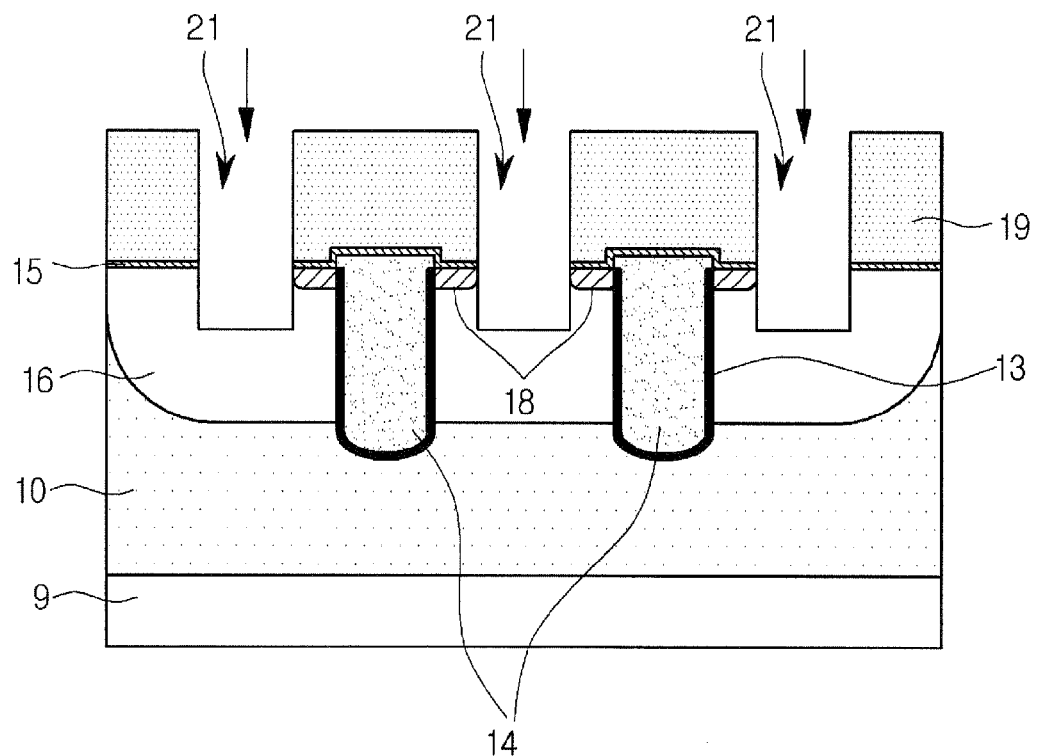

Referring to FIG. 13, second conductive type impurity ions can be implanted into the second conductive well 16 at regions exposed by the third trenches 21. This ion implantation can be used to inhibit leakage current.

Figure 14:
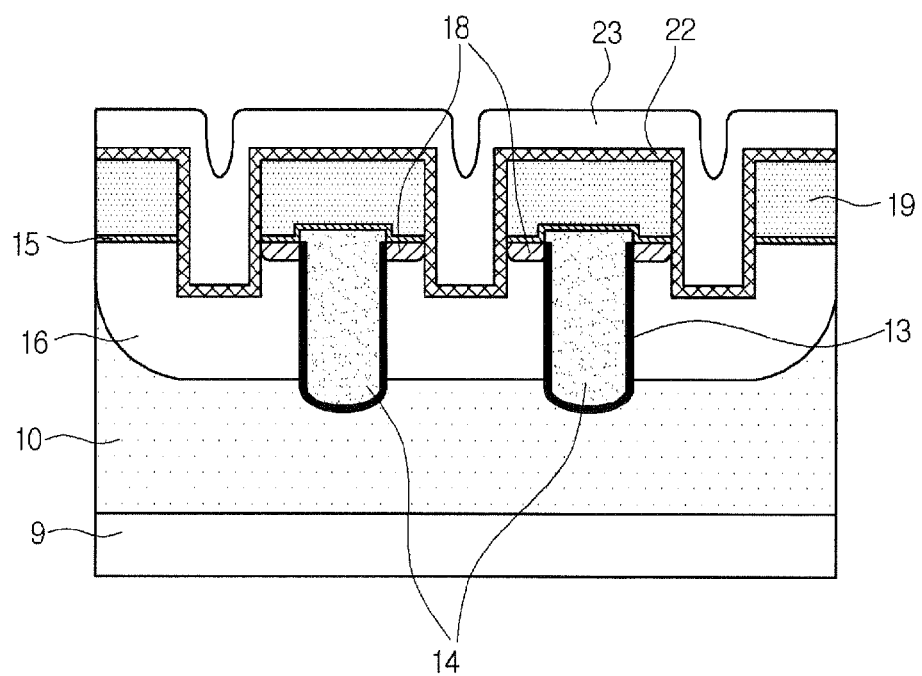

Referring to FIG. 14, the barrier layer 22 can be formed on the semiconductor substrate including the third trenches 21. Then, tungsten 23 can be deposited through a CVD process to partially gap-fill the third trenches 21. Then, the tungsten 23 can be etched using an etch-back process. In an embodiment, the tungsten 23 can be deposited through the CVD process such that a void can be inhibited from occurring in the third trenches 21.

Referring to FIG. 15, aluminum 24, having a low resistance, can be deposited on the tungsten 23 and then planarized to form the source contact. The planarization can be accomplished through an etch-back or polishing process.

Thereafter, a passivation process and a back grinding process of the semiconductor substrate can be performed to form a drain electrode 8 electrically connected with the first conductive buried layer 9 of the semiconductor substrate.

According to the embodiment as described above, contact resistance caused by high operation voltage is minimized in a power transistor in which the source region 18 and the drain electrode 8 are vertically disposed. The semiconductor substrate is partially etched to form trenches for the source contact, thereby minimizing the distance between the source region 18 and the drain electrode 8.

Meanwhile, when the source contact is formed by sputtering aluminum in the trenches, voids may frequently occur. In this regard, tungsten can be deposited through a CVD process to partially gap-fill the third trenches, and then the source contact is formed by sputtering aluminum.

As described above, embodiments of the present invention can provide a semiconductor device and a method for manufacturing the same, which can minimize the distance between the source region and the drain region. Further, a semiconductor device and a method for manufacturing the same are provided which can efficiently form a contact in the source region.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A semiconductor device comprising:
    a semiconductor substrate comprising a first conductive type buried layer, a first conductive type drift region on the first conductive type buried layer, and a second conductive type well formed on the first conductive type drift region;
    a gate insulating layer and a gate electrode disposed in regions of the semiconductor substrate from which a portion of the first conductive type drift region and a portion of the second conductive type well are removed;
    a first conductive type source region at sides of the gate electrode;
    an insulating layer on the semiconductor substrate including the gate electrode;
    a barrier layer on the insulating layer and in a trench provided through the insulating layer and a portion of the second conductive type well;

a source contact on the barrier layer and in the trench; and
a drain electrode layer below the first conductive type buried layer;
wherein the source contact comprises tungsten on the barrier layer and aluminum on the tungsten.

2. The semiconductor device according to claim 1, wherein the tungsten fills part of the trench and the aluminum is on the tungsten including the part of the trench.

3. The semiconductor device according to claim 1, further comprising a second conductive type impurity layer in the second conductive type well below the trench.

4. The semiconductor device as according to claim 1, wherein a portion of the source contact is positioned below a surface of the semiconductor substrate.

5. The semiconductor device according to claim 1, wherein the insulating layer comprises an oxide layer on the semiconductor substrate and an interlayer dielectric layer on the oxide layer.

6. A method for manufacturing a semiconductor device comprising:
forming a first conductive type buried layer and a first conductive type drift region on the first conductive type buried layer in a semiconductor substrate;
forming a first trench in the semiconductor substrate in a portion of the first conductive type drift region;
forming a gate insulating layer and a gate electrode in the first trench;
forming a second conductive type well in the first conductive type drift region;
forming a first conductive type source region in the second conductive type well at sides of the gate electrode;
forming an interlayer dielectric layer on the semiconductor substrate;
forming a second trench by selectively removing the interlayer dielectric layer and a portion of the second conductive type well;
forming a barrier layer in the second trench;
forming a source contact on the barrier layer in the second trench; and
forming a drain electrode layer below the first conductive buried layer;
wherein forming the source contact comprises filling tungsten and aluminum in the second trench.

7. The method according to claim 6, wherein forming the first trench comprises:
forming and patterning a hard mask layer on the semiconductor substrate;
etching the first conductive drift region by using the hard mask layer as a mask; and
removing the hard mask layer.

8. The method according to claim 7, further comprising forming an oxide layer on the semiconductor substrate before forming the first conductive type source region.

9. The method according to claim 8, wherein forming the first conductive source region comprises:
forming a photoresist layer pattern on the oxide layer to expose the gate electrode and a portion of the second conductive well corresponding to sides of the gate electrode;
implanting first impurity type ions using the photoresist layer pattern as a mask;
removing the photoresist layer pattern; and
diffusing the first impurity type ions by performing heat treatment relative to the semiconductor substrate.

10. The method according to claim 6, wherein filling the tungsten and the aluminum in the second trench comprises depositing the tungsten using a CVD process.

11. The method according to claim 6, wherein filling the tungsten and the aluminum in the second trench comprises depositing the aluminum using a sputtering process.

12. The method according to claim 6, wherein forming the source contact further comprises: planarizing the aluminum after filling the tungsten and the aluminum in the second trench.

13. The method according to claim 6, wherein the tungsten is filled in a part of the trenches and the aluminum is filled in a remaining part of the trench in which the tungsten is not filled.

14. The method according to claim 6, further comprising implanting second conductive type impurity ions into the second conductive type well below the second trench before forming the barrier layer in the second trench.

* * * * *